United States Patent [19]
Yoshida et al.

[11] Patent Number: 5,615,156
[45] Date of Patent: Mar. 25, 1997

[54] SEMICONDUCTOR MEMORY DEVICE HAVING PLURAL MEMORY MATS WITH CENTRALLY LOCATED RESERVE BIT OR WORD LINES

[75] Inventors: Hiroyuki Yoshida, Ryugasaki; Takashi Inui, Tshuchiura; Shigeki Numaga, Ami-machi; Kiyoshi Nakai, Ohme; Yukihide Suzuki, Akishima, all of Japan

[73] Assignees: Texas Instruments Incorporated, Dallas, Tex.; Hitachi, Ltd., Japan

[21] Appl. No.: 250,130

[22] Filed: May 27, 1994

[30] Foreign Application Priority Data

May 27, 1993 [JP] Japan .................................. 5-146684

[51] Int. Cl.⁶ .................................................. G11C 29/00
[52] U.S. Cl. .............................. 365/200; 365/63; 365/69; 365/190; 365/230.03; 365/230.06
[58] Field of Search ...................................... 365/200, 190, 365/63, 230.03, 230.06, 69, 206

[56] References Cited

U.S. PATENT DOCUMENTS

| | | | |
|---|---|---|---|
| 4,847,810 | 7/1989 | Tagani | 365/200 |
| 5,134,588 | 7/1992 | Kubota et al. | 365/63 X |
| 5,214,601 | 5/1993 | Hidaka et al. | 365/63 |
| 5,355,337 | 10/1994 | Kim | 365/200 |
| 5,394,369 | 2/1995 | Kagami | 365/200 |

*Primary Examiner*—Do Hyun Yoo
*Attorney, Agent, or Firm*—William E. Hiller; Richard L. Donaldson

[57] ABSTRACT

A semiconductor memory device having reserve bit lines or word lines for replacing defective bit lines or word lines which can increase a defect relief probability and improve an operational margin. The reserve bit lines or word lines are provided approximately in a central portion of a memory mat. Because of a low probability of defect occurrence in the reserve word lines or bit lines, the probability of defect occurrence can be made low when a defective word line or bit line is replaced with a reserve word line or bit line.

9 Claims, 3 Drawing Sheets

SEMICONDUCTOR MEMORY DEVICE HAVING PLURAL MEMORY MATS WITH CENTRALLY LOCATED RESERVE BIT OR WORD LINES

The present invention relates to a semiconductor memory device and, more specifically, to a technique that is effectively used for a defect relief circuit in a semiconductor memory device having a twist portion in complementary bit lines.

BACKGROUND OF THE INVENTION

There is known a dynamic RAM (random access memory) of a type which has reserve word lines or bit lines (also called data lines or digit lines) to compensate for defective bit lines or data lines. For example, Japanese Patent Laid-Open No. 214699/1991 discloses a defect relief technique in the above type of dynamic RAM.

Conventional dynamic RAMs have a problem that a defect is not necessarily relieved even if, for instance, a defective word line is replaced with a reserve word line. To solve this problem, it may be conceivable to perform defect relief by testing reserve word lines to determine whether they are defective or not. However, to determine whether reserve word lines are defective or not, it is necessary to establish a test mode that is different from an ordinary operation and then perform a test by accessing memory cells that are connected to reserve word lines or bit lines. Therefore, its procedure and test pattern generation are different than the case of a usual test pattern. For this reason, in mass-production of dynamic RAMs, which requires shortening of a test period, it is presently difficult to test every reserve word line or bit line.

In conventional dynamic RAMs, reserve word lines or bit lines are provided in an end portion of a memory mat. In accordance with the present invention, it was intended to increase a substantial defect relief probability paying attention to the fact that the rate of defect occurrence is higher in an end portion of a memory mat than in its central portion. Furthermore, in accordance with the present invention, a problem was found in that in a dynamic RAM having twisted bit lines in a central portion to reduce influences of capacitance coupling between adjacent bit lines, if reserve word lines are provided in an end portion of a memory mat, unbalance occurs in the numbers of crossing word lines, resulting in unbalanced bit line capacitances.

An object of the present invention is to provide a semiconductor memory device which can increase a defect relief probability.

Another object of the invention is to provide a semiconductor memory having an improved operational margin.

The above and other objects and novel features of the invention will become apparent from the description of this specification and the accompanying drawings.

SUMMARY OF THE INVENTION

In accordance with the invention, a semiconductor memory device is provided which is equipped with reserve bit lines or word lines for replacing defective bit lines or word lines, wherein the reserve bit lines or word lines are provided approximately in a central portion of a memory mat.

According to the semiconductor memory device of the invention, because of a low probability of defect occurrence in the reserve word lines or bit lines, the probability of defect occurrence can be made low when a defective word line or bit line is replaced with a reserve word line or bit line.

Figure 1:
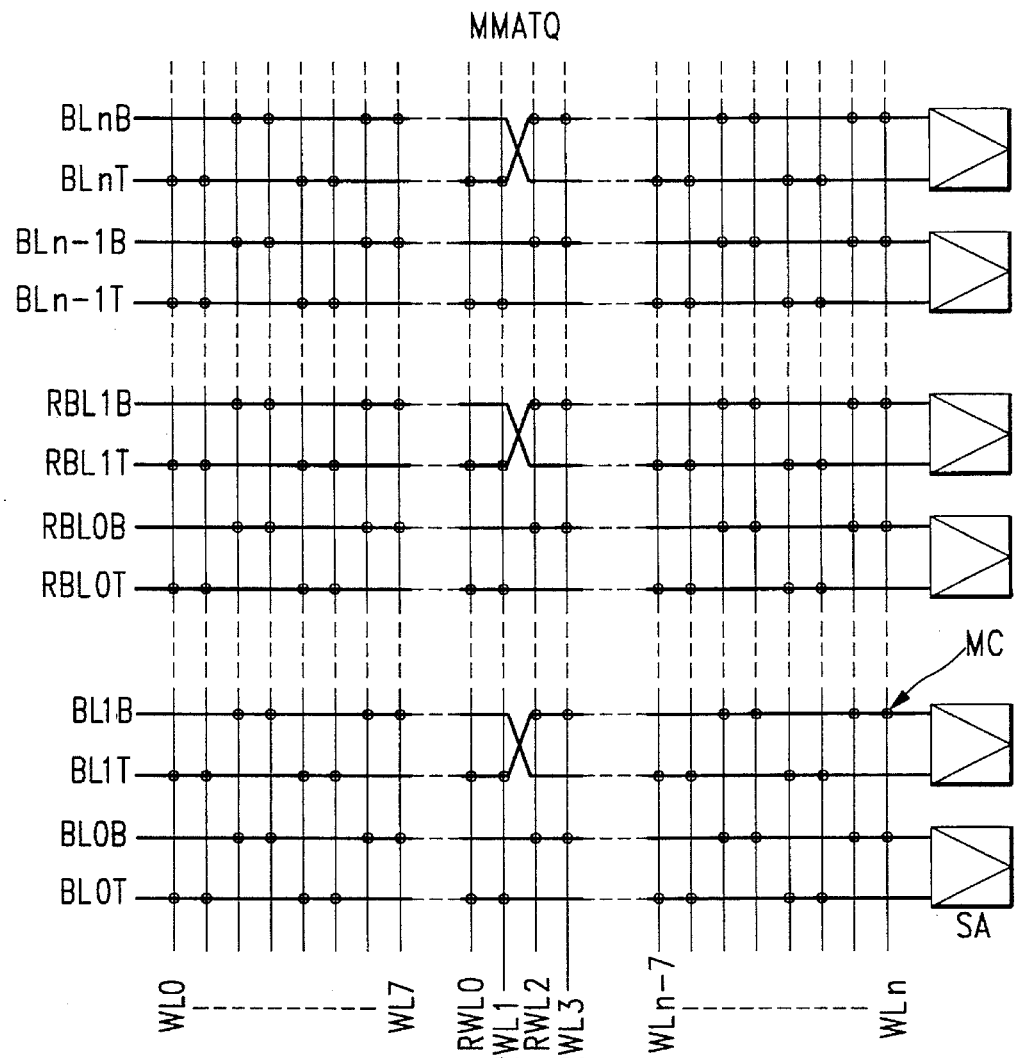
FIG. 1 is a schematic pattern diagram showing an embodiment of a memory mat portion of a dynamic RAM according to the present invention.

Reference symbols as shown in the drawings:
MMAT0–MMAT7 . . . Memory mats; MARY0, MARY1 . . . Memory arrays; XD0–XD7 . . . Decoder circuits; WD0–WD7 . . . Word drivers; SA01–SA67 . . . Sense amplifiers; YD . . . Column decoder circuit; MATCTRL01–MATCTRL04 . . . Mat control circuits; TG . . . Timing control circuit; I/O . . . Input/output circuit; RAB . . . row address buffer; CAB . . . Column address buffer; AMX . . . multiplexer; RFC . . . Refresh address counter circuit; XPD, YPD . . . Predecoders; X-DEC . . . Column redundant circuit; XIB . . . Decoder circuit

DESCRIPTION OF PREFERRED EMBODIMENT

FIG. 1 is a schematic pattern diagram of an embodiment of a memory mat portion of a dynamic RAM according to the present invention. Respective circuits and a wiring of FIG. 1 are formed on a single semiconductor substrate such as a single crystal silicon by a known semiconductor integrated circuit manufacturing process. The respective circuits and the wiring of FIG. 1 are drawn so as to approximately conform to their actual geometrical arrangement on a semiconductor substrate.

Word lines WL0–WLn are arranged in parallel with each other so as to extend vertically in FIG. 1. Pairs of complementary bit lines extend horizontally in parallel and each pair is connected to a pair of nodes (input/output nodes) of a sense amplifier SA. In this embodiment, to cancel out an influence of capacitance coupling between adjacent bit lines by the differential sense amplifier SA, complementary bit lines BL1T and BL1B, having an odd number have, are twisted in their central portion, though the invention is not intended to be limited to such a case.

In this embodiment, to increase the defect relief probability by a simple configuration, two reserve word lines RWL0 and RWL1 are provided in the central portion on the left side of the twist portion, and another two reserve word lines RWL2 and RWL3 are provided in the central portion on the right side of the twist portion.

With the above configuration, when viewed from the complementary bit lines, the numbers of word lines, including the reserve word lines, that cross those bit lines can be made the same. Therefore, the number of memory cells connected to the bit lines on the left side of the twist portion and that on the right side of the twist portion can be made the same, to enable proper balancing of the capacitances and thereby increase the operational margin.

In general, one word line is selected from four word lines selected by a unit decoder. Therefore, when the twist portion as described above is provided, the part having reserve word lines becomes longer by a pitch of four word lines, and the number of memory cells connected to the word lines in that part becomes larger to cause an unbalance as mentioned above. On the other hand, in the invention, in which two reserve word lines can be arranged side by side on each side of the twist portion (four word lines in total), it is possible to provide a reserve decoder common to those word lines.

In this embodiment, two pairs of reserve bit lines are provided in the central portion of the memory mat as denoted by RBL0T/RBL0B and RBL1T/RBL1B. Sense amplifiers SA are provided for the respective pairs of complementary bit lines RBL0T/RBL0B and RBL1T/RBL1B, and controlled in the same manner as the other sense amplifiers. Therefore, unlike the case of the reserve word lines, the sense amplifiers for the reserve bit lines RBL0T/RBL0B and RBL1T/RBL1B are rendered in an operational state irrespective of whether those bit lines are being used for defect relief. Since the bit lines RBL1T and RBL1B of one of the two pairs have a twist portion in the central portion, the bit lines, as a whole, maintain regularity involving pairs having the twist portion and pairs not having it.

In FIG. 1, a memory cell MC is connected to an intersection (indicated by a mark 0) of a word line and a complementary bit line. As is well known, the memory cell MC comprises a MOSFET for address selection and a capacitor for information storage. The gate of the address selection MOSFET is connected to a word line and its source or drain is connected to a bit line. The remaining source or drain of the address selection MOSFET is connected to one electrode of the capacitor.

In the above configuration, the probability of defect occurrence is lower in the central portion of the memory mat than in its end portion. Therefore, the defect relief probability can be increased in a defect relief scheme in which when a defect occurs in a certain regular word line, it is replaced with a reserve word line indiscriminately, i.e., without testing the reserve word lines. Since, as described above, the defect relief probability can be increased even without testing the reserve word lines, this embodiment can effectively be applied to dynamic RAMs etc., which are mass-produced general purpose memories.

A data scramble logic can be simplified by use of row addresses centering the twist portion, as described below. Since the exchange of complementary bit lines reverses readout data levels, the data writing and reading for a test needs to be performed with correction of the above data level reversing by a logical measure. In this type of data scramble processing, since the physical levels of the memory cells located on both sides of the twist portion are input to the sense amplifier in a reversed manner, it is sufficient to perform inversion/non-inversion processing by use of high/low levels of a one-bit address corresponding to the twist portion. This is effective in a test mode at the time when a defective word line is replaced with a reserve word line.

Figure 2:
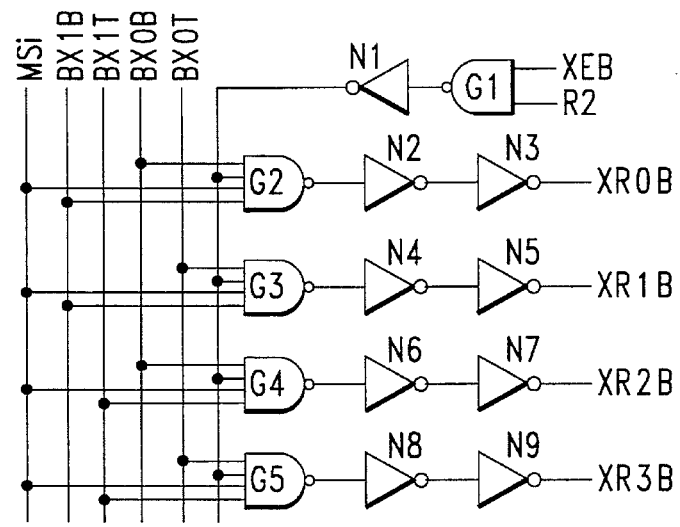
FIG. 2 is a circuit diagram showing an embodiment of a reserve word line selection circuit.

FIG. 2 is a circuit diagram showing an embodiment of a reserve word line selection circuit. A signal XEB turns to a high level when access to a defective word line is detected. The signal XEB and a RAS timing signal R2 are input to a NAND gate circuit G1, and an output signal of the NAND gate circuit G1 enables reserve word line selection circuits via an inverter circuit N1.

A signal MSi is a mat selection signal. Signals BX1B/BX1T and BX0B/BX0T correspond to address signals of the lower two bits, and serve to select one of the four word lines. NAND gate circuits G2–G5 are enabled by the output signal of the inverter circuit N1 and the mat selection signal MSi, and the internal address signals BX1B/BX1T and BX0B/BX0T are decoded to turn one of the reserve word line selection signals XR0B–XR3B to a low level. As a result, a reserve word line corresponding to one of the reserve word line selection signals XR0B–XR3B that has turned to a low level is selected to replace a defective word line.

Figure 3:
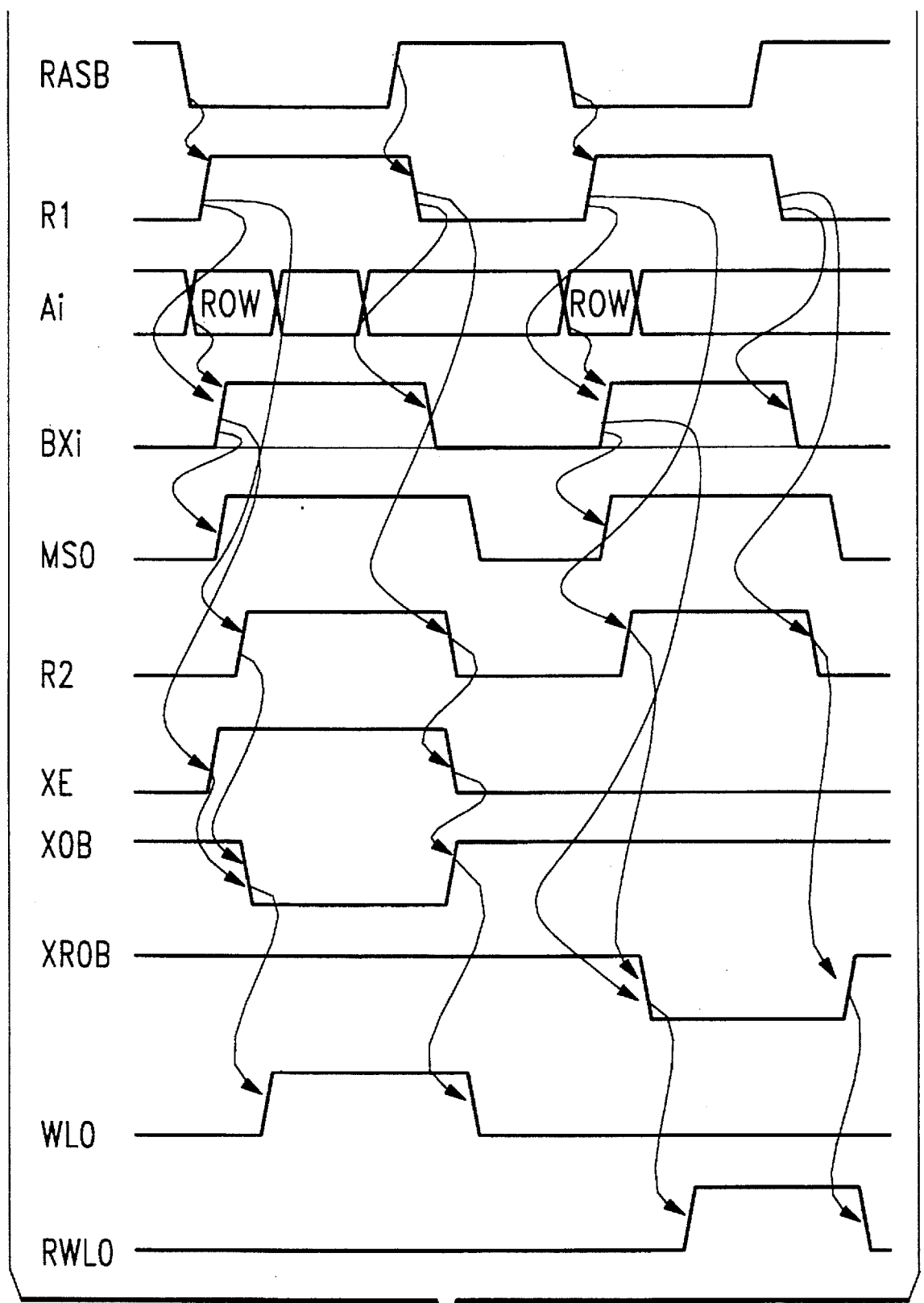
FIG. 3 is a timing chart of an embodiment to illustrate a word line selecting operation.

FIG. 3 is a timing chart of an embodiment to illustrate a word line selecting operation. When a row address strobe signal RASB turns to a low level, a row address signal is taken in. That is, when the signal RASB turns to the low level, an internal signal R1 turns to a high level and an address signal Ai is taken in as a row address ROW.

The level of an internal signal BXi is determined in accordance with the row address ROW thus taken in. By decoding the internal signal BXi, a mat selection signal MS0 turns to a high level. Comparison with a defective address is performed by use of the signal R1. If access to a defective address is not attempted, a signal XE is turned to a high level. An internal signal R2 turns to a high level with a certain delay from the signal R1. Based on the signals R2 and XE, a word line selection timing signal X0B corresponding to one of the four word lines is turned to a low level. Since a selection signal for the four word lines has been generated by a predecoder circuit for decoding the other row address signals, the word line WL0 is turned to a high level, i.e., selected in synchronism with the turning of the signal X0B to the low level.

When a memory access is directed to a defective word line in the next memory cycle, the signal XE is kept at the low level. As a result, selection of the defective word line is prohibited. The signal XEB as shown in FIG. 2 turns to the high level, and a selection signal XR0B corresponding to the reserve word line is turned to a low level at a timing when the signal R2 is at the high level. In synchronism with the turning of the signal XR0B to the low level, the reserve word line RWL0 turns to a high level, i.e., rendered into a selected state.

Figure 4:
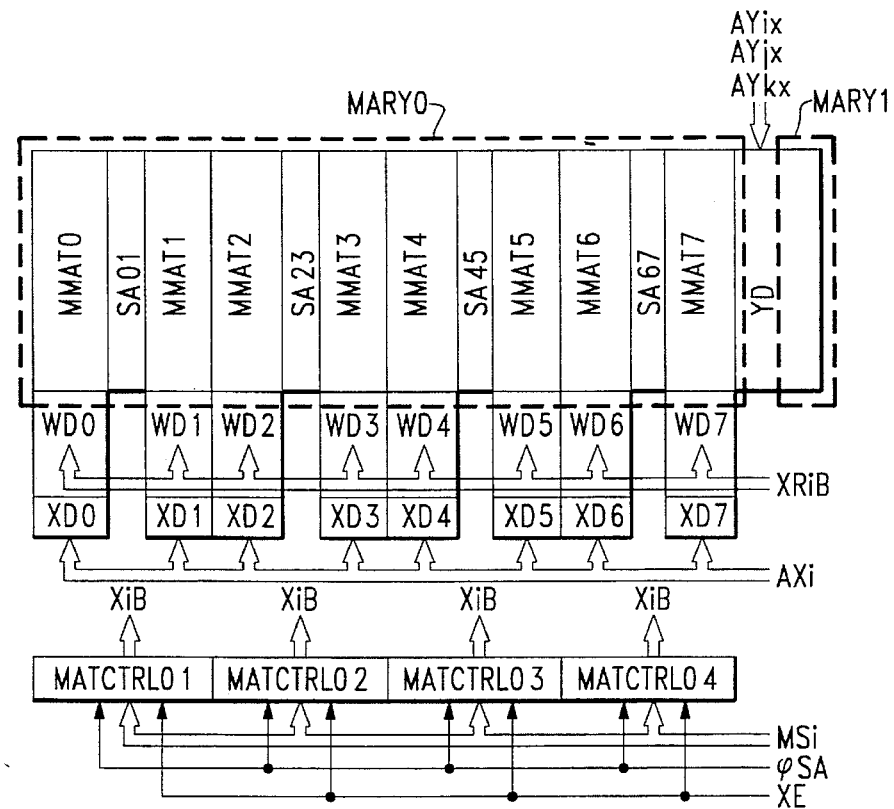
FIG. 4 is a block diagram showing an embodiment of a memory array portion and its peripheral circuit of the dynamic RAM according to the invention.
Figure 5:
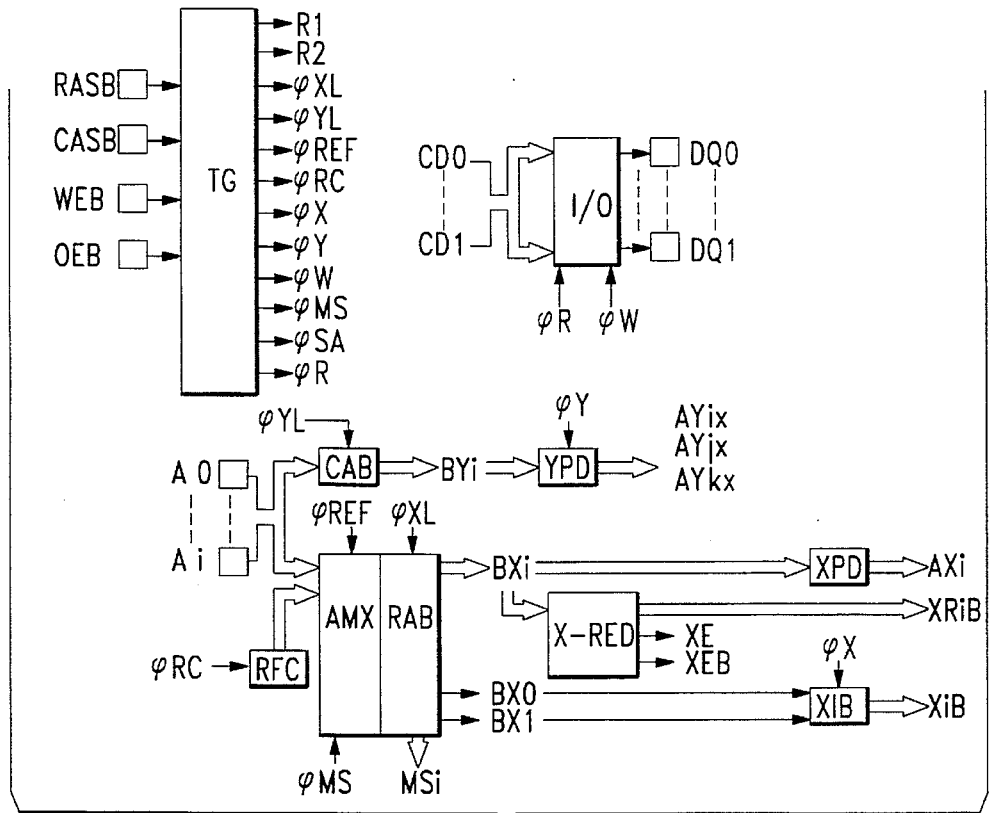
FIG. 5 is a block diagram showing an embodiment of an input/output interface portion and a timing control circuit of the dynamic RAM according to the invention.

FIGS. 4 and 5 are block diagrams showing an embodiment of the main part of the dynamic RAM according to the invention. FIG. 4 shows a memory array and its peripheral circuit, and FIG. 5 shows an input/output interface section including an address buffer and an input/output buffer, and a timing control circuit.

As shown in FIG. 4, a sense amplifier SA01 is provided between two memory mats MMAT0 and MMAT01. That is, the sense amplifier SA01 is a shared sense amplifier that is selectively used for the two memory mats MMAT0 and MMAT1. A selection switch (not shown) is provided in an input/output section of the sense amplifier SA01, and connected to complementary bit lines of the memory mat MMAT0 or MMAT1.

The other pairs of memory mats MMAT2/MMAT3, MMAT4/MMAT5 and MMAT6/MMAT7 share sense amplifiers SA23, SA45 and SA67, respectively. In this manner, one memory array MARY0 comprises the eight memory mats and the four sense amplifiers. A Y-decoder YD is provided for the memory array MARY0. A memory array MARY1 is provided on the other side of the Y-decoder YD in a symmetrical manner. The memory array MARY1 has a configuration similar to that of the memory array MARY0 though its internal configuration is omitted in FIG. 4.

Decoders XD0–XD7 are provided for the respective memory mats MMAT0–MMAT7. Each of the decoders XD0–XD7 decodes an address signal AXi that is an output signal of a predecoder circuit XPD, and generates a selection signal for the four word lines. Word drivers WD0–WD7 are provided which generate word line selection signals based on output signals of the decoders XD0–XD7 and mat control circuits MATCTRL01–MATCTRL04 (described below). These word drivers include word drivers corresponding to the reserve word lines.

The mat control circuit MATCTRL01 is provided for the pair of memory mats MMAT0 and MMAT1. The similar mat control circuits MATCTRL02, MATCTRL03 and MATCTRL04 are provided for the other memory mat pairs MMAT2/MMAT3, MMAT4/MMAT5 and MMAT6/MMAT7, respectively. In response to a mat selection signal MSi, signal XE, sense operation timing signal ΦSA and a decoded signal of the lower two bits of the address signal, one of the mat control circuits MATCTRL01–MATCTRL04 that corresponds to the selected memory mat outputs a selection signal XiB for selecting one of the four word lines. Further, the mat control circuit generates selection signals for keeping in an on state a bit line selection switch corresponding to a memory mat located on the right or left side of the selected memory mat and for keeping bit line switches corresponding to the non-selected memory mats in an off state, and a timing signal for starting the amplifying operation of the sense amplifier.

When access to a defective word line is attempted, the output of the selection signal XiB etc. is prohibited by turning of the signal XE to the low level and, therefore, the operation of selecting the defective word line is stopped. Instead, a selection signal XRiB on the redundant circuit side is generated to select a reserve word line.

With reference to FIG. 5, in response to a row address strobe signal RASB, a column address strobe signal CASB, a write enable signal WEB and an output enable signal OEB which are supplied through external terminals, a timing control circuit TG judges an operation mode and generates various timing signals that are necessary for the operation of the internal circuit in accordance with the judgment.

The row internal timing signals R1 and R2 are used as described in connection with FIG. 3. A timing signal ΦXL, which serves to cause row addresses to be taken in and retained, is supplied to a row address buffer RAB. That is, in response to the timing signal ΦXL, the row address buffer RAB takes in addresses that are input through address terminals A0–Ai to retain those addresses in a latch circuit.

A timing signal ΦYL, which serves to cause column addresses to be taken in and retained, is supplied to a column address buffer CAB. That is, in response to the timing signal ΦYL, the column address buffer CAB takes in addresses that are input through the address terminals A0–Ai to retain those addresses in a latch circuit.

A signal ΦREF, which is generated in a refresh mode, is supplied to a multiplexer AMX that is provided in an input section of the row address buffer to effect switching to a refresh address signal that is generated by a refresh address counter RFC in the refresh mode. The refresh address counter circuit RFC generates the refresh address signal by counting refresh stepping pulses ΦRC generated by the timing control circuit TG.

A word line selection timing signal ΦX is supplied to a decoder XIB, which generates four kinds of word line selection timing signals XiB based on a decoded signal of the lower two bits of the address signal. A column selection timing signal ΦY is supplied to a column predecoder YPD, which outputs column selection signals AYix, AYjx and AYkx.

A timing signal ΦW is a control signal for indicating a writing operation, and a timing signal ΦR is a control signal for indicating a reading operation. The timing signals ΦW and ΦR are supplied to an input/output circuit I/O to activate an input buffer and render an output buffer in an high impedance state in the writing operation, the input and output buffers being incorporated in the input/output circuit I/O. On the other hand, in the reading operation, the timing signals ΦW and ΦR activate the output buffer and render the input buffer in a high impedance state.

A timing signal ΦMS, which is a signal for indicating a mat selecting operation, is supplied to the row address buffer RAB, which outputs the mat selection signal MSi in synchronism with this timing signal. A timing signal ΦSA indicates the operation of the sense amplifiers. Sense amplifier activation pulses are generated based on the timing signal ΦSA. Further, the timing signal ΦSA is used to generate control signals for operations of finishing precharging of complementary bit lines and separating bit lines on the side of non-selected memory mats.

In the above embodiment, a row redundant circuit X-RED is shown as a representative example. That is, the circuit X-RED includes a memory circuit for storing a defective address and an address comparison circuit, which compares the defective address stored therein and the internal address signal BXi that is sent from the row address buffer RAB. If the two addresses do not coincide, the row redundant circuit X-RED turns the signals XE and XEB to a high level and a low level, respectively. If the two addresses coincide with each other, the row redundant circuit X-RED turns the signal XE to a low level to prohibit the operation of selecting the defective word line of the regular circuit, and turns the signal XEB to a high level to cause the selection circuit as shown in FIG. 2 to output the selection signal XRiB for selecting one reserve word line.

Although omitted in FIG. 5, column circuits similar to the above row circuits are provided. When the column circuits detect a memory access to a defective bit line, they prohibit the operation of selecting the defective bit line by the column decoder YD, and generate a selection signal for selecting a reserve bit line.

The following advantages are obtained by the above embodiments.

(1) Since the reserve bit lines or word lines are located approximately in the central portion of the memory mat, in which case the reserve word lines or bit lines have a low probability of defect occurrence, the probability of defect occurrence when a defective word line or bit line is replaced with a reserve word line or bit line can be reduced.

(2) By providing the same number of reserve word lines on each side of the twist portion of the complementary bit lines, the capacitances between the complementary bit lines can be balanced to improve the operational margin.

While the invention has been described by way of certain embodiments, it should be understood that the invention is not limited to the embodiments but is capable of modification in a variety of ways within the scope of its essential features. For example, where, as described above, the same number of reserve word lines are separately provided on each side of the twist portion of the complementary bit lines to balance capacitances of the bit lines, the complementary bit lines may be provided in a peripheral portion of the memory mat in connection with, for instance, the layout of other components.

A single dynamic RAM may comprise four memory arrays by using the same memory arrays and Y-decoders as those shown in FIG. 4. Similarly, a single dynamic RAM may comprise four sets of memory arrays, each set including four memory arrays. In this manner, in practice the memory array configuration of the dynamic RAM can take various forms.

Semiconductor memory devices having complementary bit lines include static RAMs as well as folded bit line type dynamic RAMs. Also in static RAMs, influences of coupling between bit lines can be reduced by providing a twist portion in every other complementary bit line. Therefore, by providing the same number of reserve word lines on each side of the twist portion of the complementary bit lines, the operational margin can be improved similarly and, at the same time, the data scrambling can be simplified.

The invention can be applied to dynamic RAMs and static RAMs having complementary bit lines (described above), but also to various ROMs. RAMs and ROMs are not limited to those that comprise an integrated circuit memory, but may be those incorporated in a digital integrated circuit such as a microcomputer.

In accordance with the invention, by utilizing the fact that reserve word lines and bit lines have a low probability of defect occurrence when they are provided approximately in a central portion of a memory mat, the probability of defect occurrence when a defective word line or bit line is replaced with a reserve word line or bit line can be made low.

We claim:

1. A semiconductor memory device comprising:

at least one memory array having a plurality of memory mats, each of said memory mats being arranged in a matrix of rows and columns of individual memory cells respectively defining a plurality of word lines and a plurality of bit lines intersecting with the word lines;

each of said memory mats of memory cells including a main memory mat sector of word lines and bit lines as part of a regular memory configuration;

each of said memory mats of memory cells further including a redundant group of a plurality of reserve lines of one of the word lines and bit lines, the reserve lines of one of the word lines and bit lines being disposed approximately in a central portion of the memory mat in which they are present such that the corresponding ones of the word lines and bit lines included in each memory mat as part of the regular memory configuration are arranged on opposite sides of the reserve lines of said one of the word lines and bit lines included in each of the redundant groups;

means operably connected to said at least one memory array for providing a line selection signal for selecting a single one of the plurality of one of the word lines and bit lines of a respective memory mat for use in implementing a memory operation;

means to prohibit the output of the line selection signal from said line selection means in response to an attempted access to a defective one of the word lines and bit lines in the regular memory configuration of said respective one of said plurality of memory mats; and a redundant memory address decoder responsive to the attempted access to a defective one of the word lines and bit lines in said respective one of said plurality of memory mats for generating an output selection signal to select one of a reserve word line and a reserve bit line as a replacement for the defective one of the word lines and bit lines.

2. A semiconductor memory device comprising:

at least one memory array having a plurality of memory mats, each of said memory mats being arranged in a matrix of rows and columns of individual memory cells respectively defining a plurality of word lines and a plurality of bit lines intersecting with the word lines;

each of said memory mats of memory cells including a main memory mat sector of word lines and bit lines as part of a regular memory configuration;

each of said memory mats of memory cells further including a redundant group of a plurality of reserve lines of one of the word lines and bit lines, the reserve lines of one of the word lines and bit lines being disposed approximately in a central portion of the memory mat in which they are present such that the corresponding ones of the word lines and bit lines included in each memory mat as part of the regular memory configuration are arranged on opposite sides of the reserve lines of said one of the word lines and bit lines included in each of the redundant groups;

a plurality of address decoders respectively corresponding to the plurality of memory mats for receiving a coded signal and providing an address selection signal for selecting a plurality of one of the word lines and bit lines included in the respective memory mat corresponding thereto;

a plurality of memory mat control circuits for providing selection output signals for selecting a single one of the plurality of one of the word lines and bit lines, said plurality of memory mat control circuits being operably connected to said plurality of address decoders ad providing a selection output signal thereto for selecting a single one of the plurality of one of the word lines and bit lines selected by the respective address decoders;

a plurality of word drivers interconnected between said plurality of address decoders and said plurality of memory mats for generating word line selection signals in response to the address selection signal of said address decoders and the output signal of said memory mat control circuits;

means to prohibit the output of the selection output signal from any one of said plurality of memory mat control circuits in response to an attempted access to a defective one of the word lines and bit lines in the regular memory configuration of one of said plurality of memory mats; and a redundant memory address decoder responsive to the attempted access to a defective one of the word lines and bit lines in one of said plurality of memory mats for generating an output selection signal to select one of a reserve word line and a reserve bit line as a replacement for the defective one of the word lines and bit lines.

3. A semiconductor memory device as set forth in claim 2, wherein the redundant group of a plurality of reserve lines includes both reserve word lines and reserve bit lines.

4. A semiconductor memory device as set forth in claim 2, wherein the redundant group of a plurality of reserve lines comprises reserve word lines.

5. A semiconductor memory device as set forth in claim 2, wherein the redundant group of a plurality of reserve lines comprises reserve bit lines.

6. A semiconductor memory device as set forth in claim 4, wherein each of the columns of memory cells included in said plurality of memory mats defines a composite bit line comprising a pair of complementary bit lines, at least some of said pairs of complementary bit lines having a twist portion in their central portions interconnecting the complementary bit lines of the respective pair;

each of said pairs of complementary bit lines which do not have said twist portion in the central portions thereof being arranged alternately with said pairs of complementary bit lines having the twist portion in the central portions thereof; and the same number of reserve word lines being provided on each side of said twist portion included in respective pairs of complementary bit lines.

7. A semiconductor memory device as set forth in claim 5 further including a plurality of sense amplifiers, each of said plurality of sense amplifiers being connected to a corresponding pair of complementary bit lines in the regular memory configuration and in the redundant group containing the pairs of reserve bit lines, said sense amplifiers corresponding to the pairs of complementary bit lines being operational regardless of whether the respective pair of complementary reserve bit lines corresponding thereto have been accessed for replacement of a defective pair of complementary bit lines included in the regular memory configuration.

8. A semiconductor memory device as set forth in claim 4, further including a reserve word line selection circuit comprising an initiating logic gate having first and second inputs for receiving a redundant detection signal and a timing signal to generate a reserve word line selection enabling signal as an output;

a plurality of logic gates corresponding to the number of reserve word lines included in the plurality of reserve word lines of a respective memory mat; and each of said plurality of logic gates having a plurality of inputs for respectively receiving a memory mat selection signal, and complementary address signals corresponding to the lower two bits of a word line address such that one of said plurality of reserve word lines is selected by the operation of said plurality of logic gates for identifying a single reserve word line as a replacement for a defective word line in the regular memory configuration.

9. A semiconductor memory device as set forth in claim 8, wherein said initiating logic gate and said plurality of logic gates included in said reserve word line selection circuit are NAND gates.

* * * * *